(12) United States Patent
Potkonjak

(10) Patent No.: US 9,513,329 B2
(45) Date of Patent: Dec. 6, 2016

(54) AGING-BASED USAGE METERING OF COMPONENTS

(75) Inventor: Miodrag Potkonjak, Los Angeles, CA (US)

(73) Assignee: Empire Technology Development LLC, Wilmington, DE (US)

( * ) Notice: Subject to any disclaimer, the term of this patent is extended or adjusted under 35 U.S.C. 154(b) by 1015 days.

(21) Appl. No.: 13/702,267

(22) PCT Filed: Jul. 30, 2010

(86) PCT No.: PCT/US2010/043963
§ 371 (c)(1),
(2), (4) Date: Dec. 5, 2012

(87) PCT Pub. No.: WO2012/015433
PCT Pub. Date: Feb. 2, 2012

(65) Prior Publication Data
US 2013/0080090 A1    Mar. 28, 2013

(51) Int. Cl.
*G01R 31/28* (2006.01)
*G06F 17/00* (2006.01)

(52) U.S. Cl.
CPC ....... *G01R 31/2851* (2013.01); *G01R 31/2856* (2013.01); *G06F 17/00* (2013.01)

(58) Field of Classification Search
None
See application file for complete search history.

(56) References Cited

U.S. PATENT DOCUMENTS 5,825,883 A   10/1998 Archibald et al.
6,047,247 A   4/2000 Iwanishi et al.
(Continued)

FOREIGN PATENT DOCUMENTS

CN   1344942 A   4/2002
CN   1566980 A   1/2005
(Continued)

OTHER PUBLICATIONS

C. Lee, M. Potkonjak, & W. H. Mangione-Smith, MediaBench: a too for evaluating and synthesizing multimedia and communicatons systems, Proceedings of the 30th annual ACM/IEEE international symposium on Microarchitecture, Dec. 1997, p. 330-335.
(Continued)

*Primary Examiner* — Aditya Bhat
(74) *Attorney, Agent, or Firm* — Moritt Hock & Hamroff LLP; Steven S. Rubin, Esq.

(57) ABSTRACT

Embodiments for aging-based usage metering of components of an IC are described herein. In various embodiments, the IC may include various components and an aging-based usage metering circuit for metering usage of the components. The components may include respective associated usage vectors that are different from one another, whereas the usage metering circuit may include circuit elements coupled to each other, forming different processing paths for processing the different usage vectors. Additionally, the components may be configured to respectively transmit their different associated usage vectors to the usage metering circuit whenever the respectively components are used. And the usage metering circuit may be configured to process the usage vectors. Further, the circuit elements of the usage metering circuit may age over time as a result of the processing, enabling usage of the components be determined based on their aging. Other embodiments may be described or claimed.

20 Claims, 5 Drawing Sheets

(56) References Cited

U.S. PATENT DOCUMENTS

| | | |
|---|---|---|
| 6,157,231 A | 12/2000 | Wasson |
| 6,223,314 B1 | 4/2001 | Arabi et al. |
| 6,469,518 B1 | 10/2002 | Davis et al. |
| 6,604,228 B1 | 8/2003 | Patel et al. |
| 6,829,515 B2 | 12/2004 | Grimm |
| 6,903,564 B1 | 6/2005 | Suzuki |
| 7,005,871 B1 | 2/2006 | Davies et al. |
| 7,017,043 B1 | 3/2006 | Potkonjak |
| 7,054,787 B2 | 5/2006 | Gauthier et al. |
| 7,075,284 B2 | 7/2006 | Watanabe et al. |
| 7,129,800 B2 | 10/2006 | Gauthier et al. |
| 7,134,600 B2 | 11/2006 | Tomoeda et al. |
| 7,219,045 B1 | 5/2007 | Wu et al. |
| 7,225,375 B2 | 5/2007 | Cochran et al. |
| 7,292,968 B2 | 11/2007 | Wu et al. |
| 7,471,161 B2 | 12/2008 | Liu |
| 7,495,519 B2 | 2/2009 | Kim et al. |
| 7,587,590 B2 | 9/2009 | Yamanda et al. |
| 7,592,876 B2 | 9/2009 | Newman |
| 7,647,205 B2 | 1/2010 | Heap et al. |
| 7,721,157 B2 | 5/2010 | Spitz et al. |
| 7,757,083 B2 | 7/2010 | Devadas et al. |
| 7,813,206 B2 | 10/2010 | Watanabe |
| 7,840,803 B2 | 11/2010 | Clarke et al. |
| 7,904,755 B2 | 3/2011 | Patel |
| 8,176,454 B2 | 5/2012 | Potkonjak |
| 8,260,708 B2 | 9/2012 | Potkonjak |
| 8,271,400 B2 | 9/2012 | Lehr et al. |
| 8,781,792 B2 | 7/2014 | Visweswariah et al. |
| 8,935,143 B2 * | 1/2015 | Kim .................. G01R 31/2856 257/48 |
| 2003/0054577 A1 | 3/2003 | Yonezawa et al. |
| 2004/0249763 A1 | 12/2004 | Vardi |
| 2005/0141174 A1 | 6/2005 | Taketani et al. |
| 2005/0168255 A1 | 8/2005 | Gauthier et al. |
| 2005/0227468 A1 | 10/2005 | Chen et al. |
| 2005/0229060 A1 | 10/2005 | Cochran et al. |
| 2006/0049886 A1 * | 3/2006 | Agostinelli ............... H03L 1/00 331/175 |
| 2008/0088356 A1 | 4/2008 | Inada et al. |
| 2008/0141072 A1 | 6/2008 | Kalgren et al. |
| 2008/0162159 A1 | 7/2008 | Wang et al. |
| 2009/0300402 A1 | 12/2009 | Patel |
| 2010/0188115 A1 | 7/2010 | von Kaenel |
| 2011/0090015 A1 | 4/2011 | Sumita et al. |
| 2012/0274480 A1 | 11/2012 | Potkonjak |
| 2013/0080090 A1 | 3/2013 | Potkonjak |
| 2015/0162199 A1 | 6/2015 | Potkonjak |

FOREIGN PATENT DOCUMENTS

| | | |
|---|---|---|
| CN | 101377538 A | 3/2009 |
| EP | 0623900 A1 | 11/1994 |

OTHER PUBLICATIONS

M. R. Guthaus, J. S. Ringenberg, D. Ernst, T. M. Austin ,T. Mudge, & R. B. Brown, MiBench: A free, commercially representative embedded benchmark suite, Proceedings of the Workload Characterization, 2001. WWC-4. 2001 IEEE International Workshop, Dec. 2001, p. 3-14.
V. Zivojnovic, J. M. Velarde, C. Schlager, & H. Meyr, DSPstone: A DSP-Oriented Benchmarking Methodology, Proc. of Signal Processing Applications & Technology, Dallas, 1994, 6 pages.
M. A. Postiff, D. Greene, G. Tyson, & T. Mudge. The limits of instruction level parallelism in SPEC95 applications. 3rd Workshop on Interaction between Compilers and computer Architectures, Oct. 1998, 10 pages.
J. L. Henning, SPEC CPU2000: Measuring CPU Performance in the New Millennium, IEEE Computer, Jul. 2000, p. 28-35 v.33 n.7.
I. Gomez, L Pinuel, M. Prieto, & F. Tirado, Analysis of simulation-adapted SPEC 2000 benchmarks, ACM SIGARCH Computer Architecture News, Sep. 2002, p. 4-10, v.30, n.4.
B. Sprunt, Pentium 4 Performance-Monitoring Features, IEEE Micro, Jul. 2002, p. 72-82, v.22, n.4.
J. Dean, J.E. Hicks, C. A. Waldspurger, W. E. Weihl, G. Chrysos, ProfileMe: hardware support for instruction-level profiling on out-of-order processors, Proceedings of the 30th annual ACM/IEEE international symposium on Microarchitecture, Dec. 1997, p. 292-302.
D. Bailey, J. Barton, T. Lasinski, & H. Simon, The NAS parallel benchmarks, Technical Report RNR-91-002 Revision 2, NASA Ames Research Laboratory, Mountain View, CA, Aug. 1991, 74 pages.
M. E. Wolf, M. S. Lam, A data locality optimizing algorithm, Proceedings of the ACM SIGPLAN 1991 conference on Programming language design and implementation, Jun. 1991, p. 30-44.
J. Huh, D. Burger, S. W. Keckler, Exploring the Design Space of Future CMPs, Proceedings of the 2001 International Conference on Parallel Architectures and Compilation Techniques, Sep. 2001, p. 199-210.
H. Kufluoglu, M. A. Alam, B. C. Paul, K. Kang & K. Roy, Impact of nbti on temporal performance degradation of digital circuits. IEEE Electron Device Letters, 2005, 560-562, 26(8).
M. A. Alam, K. Kang, H. Kufluoglu & K. Roy, Effcient transistor-level sizing technique under temporal performance degradation due to nbti. In IEEE International Conference on Computer Design (ICCD06), 2006, 6 pages.
F. Koushanfar, G.Qu, & M. Potkonjak. Intellectual property metering. In IHW '01: Proceedings of the 4th International Workshop on Information Hiding, pp. 81-95, London, UK, 2001. Springer-Verlag, 81-95.
D. K. Schroder, Negative bias temperature instability: What do we understand? Microelectron. Eng., 2007, 841-852, 47(6).
International Search Report for application with application No. PCT/US2010/043963, dated Oct. 26, 2010, 8 pages.
"The Top 30 Global Medical Device Companies," accessed at https://web.archive.org/web/20090316061246/http://www.mpo-mag.com/articles/2006/07/top-medical-device-companies-report, accessed on Mar. 16, 2015, pp. 30.
Abdollahi, A., et al., "Leakage Current Reduction in CMOS VLSI Circuits by Input Vector Control," IEEE Transactions on Very Large Scale Integration (VLSI) Systems, vol. 12, Issue 2, pp. 140-154 (Feb. 2004).
Agarwal, M., et al., "Circuit Failure Prediction and Its Application to Transistor Aging," Proceedings of the 25th IEEE VLSI Test Symmposium, pp. 277-286 (May 6-10, 2007).
Alkabani, Y. et al., "Remote activation of ICs for piracy prevention and digital right management," IEEE/ACM International Conference on Computer-Aided Design, pp. 674-677 (2007).
Alkabani, Y. et al., "Trusted Integrated Circuits: A Nondestructive Hidden Characteristics Extraction Approach," Lecture Notes in Computer Science, vol. 5284, pp. 102-117 (2008).
Alkabani, Y., et al., "Input vector control for post-silicon leakage current minimization in the presence of manufacturing variability," 45th ACM/IEEE Design Automation Conference, pp. 606-609 (Jun. 8-13, 2008).
Asenov, A., "Random Dopant Induced Threshold Voltage Lowering and Fluctuations in Sub-0.1 um MOSFETs: A 3-D Atomistic Simulation Study," IEEE Transactions on Electron Devices, vol. 45, No. 12, pp. 2505-2513 (Dec. 1998).
Beckmann, N. et al., "Hardware-Based Public-Key Cryptography with Public Physically Unclonable Functions," Information Hiding: 11th International Workshop 2009, pp. 206-220 (2009).
Blome, J., et al., "Self-calibrating Online Wearout Detection," 40th Annual IEEE/ACM International Symposium on Microarchitecture, pp. 109-122 (Dec. 1-5, 2007).
Borkar, S., "Designing reliable systems from unreliable components: the challenges of transistor variability and degradation," Micro, IEEE, vol. 25, Issue 6, pp. 10-16 (Nov.-Dec. 2005).
Borkar, S., et al., "Parameter Variations and Impact on Circuits and Microarchitecture", Proceedings of 40th Annual Design Automation Conference, pp. 338-342 (Jun. 2-6, 2003).

(56) References Cited

OTHER PUBLICATIONS

Chakravarthi, S., et al., "A Comprehensive Framework for Predictive Modeling of Negative Bias Temperature Instability," 42th Annual International Reliability Physics Symposium Proceedings, pp. 273-282 (Apr. 25-29, 2009).
Chen, T., and Naffziger, S., "Comparison of Adaptive Body Bias (ABB) and Adaptive Supply Voltage (ASV) for Improving Delay and Leakage Under the Presence of Process Variation," IEEE Transactions on Very Large Scale Integration (VLSI) Systems, vol. 11, No. 5, pp. 888-899 (Oct. 2003).
Cheng, B., et al., "Evaluation of Statistical Variability in 32 and 22 nm Technology Generation LSTP MOSFETs," Solid-State Electronics, vol. 53, Issue 7, pp. 767-772 (2009).
Cline, B., et al., "Analysis and Modeling of CD Variation for Statistical Static Timing," ICCAD '06. IEEE/ACM International Conference on Computer-Aided Design, pp. 60-66 (Nov. 5-9, 2006).
Dabiri, F. et al., "Hardware aging-based software metering," Date 2009, pp. 460-465, (2009).
European Search Report for European Application No. 10 15 6500, European Patent Office, The Hague, Netherlands, mailed on Jul. 6, 2010, 5 pages.
Feinberg, A. et al., "Transistor Aging Models of Key Device Parameters Due to Leakage Degradation," M/A-COM Reliability Tech Brief, accessed at https://web.archive.org/web/20061017163909/http://www.macom.com/QualityReliability/pdf/transistor%20aging%20TB.pdf, accessed on Mar. 16, 2015, pp. 11.
Gall, D.L., "MPEG: a video compression standard for multimedia applications," Communications of the ACM, vol. 34, Issue 4, pp. 46-58 (Apr. 1991).
Franklin, M. K. et al., "Auditable metering with lightweight security," In FC 97, pp. 151-160 (1997).
Gallager, R.G., "Variations on a theme by Huffman," IEEE Transaction on Information Theory, vol. 24, Issue 6, pp. 668-674 (Nov. 1978).
Glosekotter, P., et al., "Device Degradation and Resilient Computing" IEEE International Symposium on Circuits and Systems, pp. 828-831 (2008).
Gregg, J., et al., "Post Silicon Power/Performance Optimization in the Presence of Process Variations Using Individual Well-Adaptive Body Biasing," IEEE Transactions on Very Large Scale Integration (VLSI) Systems, vol. 15, No. 3, pp. 366-367 (Mar. 2007).
Hong, I. et al., "Behavioral Synthesis Techniques for Intellectual Property Protection," DAC-99 36th ACM/IEEE DAC Design Automation Conference, pp. 849-854 (Jun. 1999).
Hong, I. et al., "Techniques for Intellectual Property Protection of DSP Designs," ICASSP98 International Conference on Acoustic, Speech, and Signal Processing, pp. 3133-3136 (May 1998).
Huffman, D.A., "A method for the Construction of Minimum-Redundancy Codes," Proceedings of the IRE, vol. 40, Issue 9, pp. 1098-1101 (Sep. 1952).
International Search Report with Written Opinion for International Application No. PCT/US2013/020438 mailed on Mar. 11, 2013, 9 pages.
Islam, A.E., et al., "Theory and Practice of On-the-Fly and Ultra-Fast VT Measurements for NBTI Degradation: Challenges and Opportunities," Electron Devices Meeting, IEDM, pp. 805-808 (2007).
Kelsey, J. et al., "A peer-to-peer software metering system," In the Second USENIX Workshop on E-Commerce, pp. 279-286, (1996).
Kim, T-H., et al., "Silicon Odometer: An On-Chip Reliability Monitor for Measuring Frequency Degradation of Digital Circuits," IEEE Journal of Solid-State Circuits, vol. 43, Issue 4, pp. 874-880 (2008).
Kirovski, D. et al., "Intellectual Property Protection by Watermarking Combinational Logic Synthesis Solutions," ICCAD98 International Conference on Computer-Aided Design, pp. 194-198, (Nov. 1998).
Kirovski, D. et al., "Local Watermarks: Methodology and Application to Behavioral Synthesis," IEEE Transactions on Computer-Aided Design of Integrated Circuits and Systems, vol. 22, No. 9, pp. 1277-1284 (Sep. 2003).
Kirovski, D. et al., "Localized watermarking: methodology and application to operation scheduling," 2000 IEEE International Conference on Acoustics, Speech, and Signal Processing, pp. 596-599 (2000).
Koushanfar, F. et al., "Behavioral Synthesis Techniques for Intellectual Property Protection," ACM Transaction on Design Automation of Electronic Systems, vol. 10, No. 3, pp. 523-545 (Jul. 2005).
Koushanfar, F. et al., "CAD-based Security, Cryptography, and Digital Rights Management," Design Automation Conference, pp. 268-269 (Jun. 2007).
Kulkarni, S.H., et al., "Design-Time Optimization of Post-Silicon Tuned Circuits Using Adaptive Body Bias," IEEE Transactions on Computer-Aided Design of Integrated 37 Circuits and systems, vol. 27, Issue 3, pp. 481-494 (Mar. 2008).
Lach, J. et al., "Robust FPGA Intellectual Property Protection Through Multiple Small Watermarks," DAC-99 36th ACM/IEEE DAC Design Automation Conference, pp. 831-836 (Jun. 1999).
Lach, J. et al., "Signature Hiding Techniques for FPGA Intellectual Property Protection," ICCAD98 International Conference on Computer-Aided Design, pp. 186-189 (Nov. 1998).
Lall, P., et al., "Characterization of Functional Relationship Between Temperature and Microelectronic Reliability," Microelectronics and Reliability, vol. 35, Issue 3, pp. 377-402 (Mar. 1995).
Lam, M.S., "A Data Locality Optimizing Algorithm," ACM SIGPLAN Notices, vol. 39, No. 4, pp. 442-459 (Apr. 1, 2004).
Majzoobi, M. et al., "Lightweight secure PUFs," ICCAD 2008, pp. 670-673 (2008).
Majzoobi, M. et al., "Testing Techniques for Hardware Security," IEEE International Test Conference, pp. 1-10, (2008).
Markovic, D., et al., "Ultralow-Power Design in Near-Threshold Region," Proceedings of the IEEE, vol. 98, Issue 2, pp. 237-252 (Feb. 2010).
Megerian, S. et al., "Watermarking Integer Linear Programming Solutions," IEEE/ACM Design Automation Conference, pp. 8-13 (Jun. 2002).
Meguerdichian, S. et al., "Device Aging-Based Physically Unclonable Functions," Design Automation Conference (DAC), pp. 288-289 (Jun. 2011).
Meguerdichian, S. et al., "Matched Public PUF: Ultra Low Energy Security Platform," International Symposium on Low Power Electronics and Design, pp. 45-50 (Aug. 2011).
Meguerdichian, S. et al., "Security Primitives and Protocols for Ultra Low Power Sensor Systems," IEEE Sensors 2011, pp. 4 (Oct. 2011).
Meguerdichian, S. et al., "Watermarking while preserving the critical path," IEEE/ACM Design Automation Conference, pp. 108-111, (Jun. 2000).
Mostafa, H., et al., "Adaptive Body Bias for Reducing the Impacts of NBTI and Process Variations on 6T SRAM Cells," IEEE Transactions on Circuits and Systems I: Regular Papers, vol. 58, Issue 12, pp. 2859-2871 (Dec. 2011).
Nahapetian, A., et al., "Optimization for Real-Time Systems with Non-convex Power Versus Speed Models," Integrated Circuit and System Design. Power and Timing Modeling, Optimization and Simulation Lecture Notes in Computer Science, vol. 4644, pp. 443-452 (2007).
Naor, M. et al., "Secure accounting and auditing on the web," Computer Networks and ISDN Systems, pp. 541-550, vol. 30, pp. 1-14, 1998.
Nelson, M., et al., "SVD-Based Ghost Circuitry Detection," Information Hiding Lecture Notes in Computer Science, vol. 5806, pp. 221-234 (2009).
Potkonjak, M. et al., "Differential Public Physically Unclonable Functions: Architecture and Applications," Design Automation Conference (DAC), pp. 242-247 (Jun. 2011).
Potkonjak, M. et al., "Hardware Trojan horse detection using gate-level characterization," Design Automation Conference, pp. 688-693 (Jul. 2009).

(56) References Cited

OTHER PUBLICATIONS

Potkonjak, M., "Synthesis of Trustable ICs using Untrusted CAD Tools," ACM/IEEE Design Automation Conference (DAC), pp. 633-634, (2010).
Qu, G. et al., "Analysis of Watermarking Techniques for Graph Coloring Problem," ICCAD98 International Conference on Computer-Aided Design, pp. 190-193, (Nov. 1998).
Qu, G. et al., "Hiding Signatures in Graph Coloring Solutions," Information Hiding Workshop, pp. 391-408, (Sep. 1999).
Qu, G. et al., "Optimization-Intensive Watermarking Techniques for Decision Problems," DAC-99 36th ACM/IEEE DAC Design Automation Conference, pp. 33-36 (Jun. 1999).
Qu, G., and Potkonjak, M., "Fingerprinting intellectual property using constraint-addition," IEEE/ACM Design Automation Conference, pp. 587-592 (2000).
Rashid, A. et al., "Hierarchical Watermarking for Protection of DSP Filter Cores," IEEE Custom Integrated Circuits Conference, pp. 39-42 (May 1999).
Rissanen, J.J., "Generalized Kraft inequality and arithmetic coding," IBM Journal of Research and Development, vol. 20, Issue 3, pp. 198-203 (May 1976).
Shapiro, J.M., "Embedded Image-Coding using Zerotrees of Wavelet Coefficients," IEEE Transaction Signal Processing, vol. 41, Issue 12, pp. 3445-3462 (Dec. 1993).
Sonnenfeld, G., et al., "An Agile Accelerated Aging, Characterization and Scenario Simulation System for Gate Controlled Power Transistors," IEEE AUTOTESTCON, pp. 208-215 (2008).
Tazibt, W., et al., "A junction characterization for microelectronic devices quality and reliability," Microelectronics Reliability, vol. 48, Issue 3, pp. 348-353 (Mar. 2008).
Vahdatpour, A., et al., "Leakage Minimization Using Self Sensing and Thermal Management," International Symposium on Low Power Electronics and Design (ISLPED), pp. 265-270 (Aug. 18-20, 2010).
Wallace, G.K., "The JPEG still picture compression standard," Communications of the ACM, vol. 34, No. 4, pp. 30-44 (Apr. 1991).
Wang, Yu., et al., "Gate Replacement Techniques for Simultaneous Leakage and Aging Optimization," Design, Automation & Test in Europe Conference & Exhibition, pp. 328-333 (Apr. 20-24, 2009).
Wei, S. et al., "Gate-level characterization: foundations and hardware security applications," ACM/IEEE Design Automation Conference (DAC), pp. 222-227, Jun. 2010.
Wei, S. et al., "Integrated Circuit Digital Rights Management Techniques Using Physical Level Characterization," ACM Workshop on Digital Rights Management 2011, pp. 3-13 (Oct. 2011).
Wei, S. et al., "Integrated Circuit Security Techniques Using Variable Supply Voltage," Design Automation Conference (DAC), pp. 248-253 (Jun. 2011).
Wei, S. et al., "Robust Passive Hardware Metering," IEEE/ACM International Conference on Computer-Aided Design, pp. 802-809 (Nov. 2011).
Wei, S. et al., "Scalable Consistency-based Hardware Trojan Detection and Diagnosis," The 5th International Conference on Network and System Security, pp. 176-183 (Sep. 2011).
Wei, S. et al., "Scalable Segmentation-Based Malicious Circuitry Detection and Diagnosis," International Conference on Computer Aided Design, pp. 483-486, (2010).
Wei, S., and Potkonjak, M., "Scalable Hardware Trojan Diagnosis," IEEE Transactions on Very Large Scale Integration (VLSI) Systems, vol. 20, Issue 6, pp. 1049-1057 (May 27, 2011).
Wei, S., and Potkonjak, M., "Wireless Security Techniques for Coordinated Manufacturing and On-Line Hardware Trojan Detection," WiSec'12, Proceedings of the fifth ACM conference on Security and Privacy in Wireless and Mobile Networks, pp. 161-172 (Apr. 16-18, 2012).
Wei, S., et al., "Gate Characterization Using Singular Value Decomposition: Foundations and Applications," IEEE Transactions on Information Forensics and Security, vol. 7, Issue 2, pp. 765-773 (Dec. 23, 2010).
Wei, S., et al., "Hardware Trojan Horse Benchmark via Optimal Creation and Placement of Malicious Circuitry," 49th ACM/EDAC/IEEE Design Automation Conference (DAC), pp. 90-95 (Jun. 3-7, 2012).
Wei, S., et al., "Malicious Circuitry Detection Using Thermal Conditioning," IEEE Transactions on Information Forensics and Security, vol. 6, No. 3, pp. 1136-1145 (2011).
Wendt, J. B. et al., "Nanotechnology-Based Trusted Remote Sensing," IEEE Sensors 2011, pp. 1213-1216 (Oct. 2011).
Witten, I.H., et al., "Arithmetic coding for data compression," Communications of the ACM, vol. 30, No. 6, pp. 520-540 (Jun. 1987).
Wolfe, G. et al., "Watermarking Graph Partitioning Solutions," IEEE Transactions on Computer-Aided Design of Integrated Circuits and Systems, vol. 21, No. 10 pp. 486-489 (2002).
Wong, J. et al. "Fair watermarking using combinatorial isolation lemmas," IEEE Transactions on Computer-Aided Design of Integrated Circuits and Systems, vol. 23, No. 11, pp. 1566-1574, Nov. 2004.
Yuan, L., et al., "A Combined Gate Replacement and Input Vector Control Approach for Leakage Current Reduction," IEEE Transactions on Very Large Scale Integration (VLSI) Systems, vol. 14, No. 2, pp. 173-182 (Feb. 2006).
Zheng, J., et al., "Securing Netlist-Level FPGA Design through Exploiting Process Variation and Degradation," FPGA'12, Proceedings of the ACM/SIGDA international symposium on Field Programmable Gate Arrays, pp. 129-138 (Feb. 2012).
Ziv, J., and Lempel, A., "A universal algorithm for sequential data compression," IEEE Transactions on Information Theory, vol. 23, Issue 3, pp. 337-343 (May 1977).
Wei, S., et al., "Hardware Trojan House Benchmark via Optimal Creation and Placement of Malicious Circuitry", Proceedings of the 49th Annual Design Automation Conference, pp. 90-95 (Jun. 3, 2012).

* cited by examiner

Computer Program Product 700

Non-Transitory Computer Readable Storage Medium 702

704 Programming Instructions configured to cause an apparatus, in response to execution of the instructions by the apparatus, to perform operations including:

transmitting a number of input signals to an aging-based usage metering circuit;

receiving, in response, from the age-based usage metering circuit, a number of output signals; and determining, usage of components an integrated circuit based on aging of the circuit elements of the aging-based usage metering circuit;

OR receiving determined usage of components of an IC; and generating, in response, an optimization instruction for one of the components, a system service that uses one or more of the components, an application that uses one or more of the components, a tool employed to design one of the components or a tool employed to generate the system service or application, based on determined usage of the component.

FIG. 7

AGING-BASED USAGE METERING OF COMPONENTS

CROSS REFERENCE TO RELATED APPLICATION

This application is a U.S. National Stage filing under 35 U.S.C. §371 of International Application No. PCT/US10/43963 filed Jul. 30, 2010. The disclosure of the International Application is hereby incorporated by reference in its entirety.

BACKGROUND

Unless otherwise indicated herein, the materials described in this section are not prior art to the claims in this application and are not admitted to be prior art by inclusion in this section.

Many phases of design, manufacturing, and runtime management of general purpose, graphics, digital signal processing (DSP), and network processors, static and dynamic random access memory (SRAM and DRAM), field programmable gate arrays (FPGA), and other semiconductor devices and systems are guided by applications that use these devices, and their properties. It is often important that devices and systems are optimized so that common case operations and applications are executed in time, area, and power efficient and reliable ways. In particular, it is often important to properly conclude which components of a device or a system are most often used.

Application properties also may be significant factors for optimization of integrated circuits in presence of manufacturing variability and component aging (e.g., due to negative bias temperature instability (NBTI) and hot carrier injection (HCI) for gates and transistors and electromigration for interconnects.

Long-term profiling information may be used to improve optimization at all levels of abstractions of synthesis flow, including architectural, micro-architectural, register-transfer level, sequential and combinatorial logic synthesis and physical design. The information may also be used to optimize yield and performance during manufacturing and for off-line runtime optimization by posing more accurate objectives and constraints to compiler, utility tools, operation system (OS), system level management and runtime management (e.g. variable voltage management, thermal management and cache line replacement policies).

Many design and runtime measures including latency, throughput, maximal power, energy, reliability can be improved by collecting and analyzing the frequency and other statistics of component usage of the pertinent integrated circuit. Ideally, the profiling is low cost, fast, accurate, and reliable.

SUMMARY

This disclosure is drawn, inter alia, to methods, systems, devices, and/or apparatus generally related to aging-based usage metering of components of an integrated circuit (IC).

Briefly stated, in various embodiments, an IC may include various components and an aging-based usage metering circuit for metering usage of the components. The components may include respective associated usage vectors that are different from one another, whereas the aging-based usage metering circuit may include circuit elements coupled to each other, forming different processing paths for processing the different usage vectors. Additionally, the components may be configured to respectively transmit their different associated usage vectors to the aging-based usage metering circuit, whenever the components are used. And the aging-based usage metering circuit may be configured to process the usage vectors. Further, the circuit elements of the aging-based usage metering circuit may age over time as a result of the processing, enabling usage of the components be determined based on their aging.

In various embodiments, a method for metering usage of a plurality of components of an IC may include transmitting a number of usage vectors respectively associated with the components to an aging-based usage metering circuit of the IC, and processing the number of usage vectors by the aging-based usage metering circuit. In some embodiments, the method may include transmitting a number of input signals to the aging-based usage metering circuit, wherein the aging-based usage metering circuit generates a number of output signals in response to the plurality of input signals. The method may further include receiving the number of output signals from the aging-based usage metering circuit; and determining usage of the components based on aging of the circuit elements of the aging-based usage metering circuit. In some embodiments, determining may include determining usage of the components based on delays, leakage current or switching power of the elements of the aging-based usage metering circuit.

In various embodiments, a method may include receiving the determined usage of the components, generating, in response to the determined usage of the components, an optimization instruction for one of the components, a system service that uses one or more of the components, or an application that uses one or more of the components, based on determined usage of the components. In some embodiments, the method may further include generating, in response to the determined usage of the components, an optimization instruction for a tool employed to design one of the components or a tool employed to generate a system service or an application that uses one or more of the components, based on determined usage of the components.

In various embodiments, an article of manufacture may be provide with storage medium to store various instructions, configured to enable an apparatus to perform, in response to execution of the instructions by the apparatus, some or selected aspects of the various methods.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict several embodiments in accordance with the disclosure and, therefore, are not to be considered limiting of its scope, the disclosure will be described with additional specificity and detail through use of the accompanying drawings. Various embodiments will be described referencing the accompanying drawings in which like references denote similar elements, and in which:

FIG. 7 illustrates an example program product including an article of manufacture with instructions configured to perform the operations of the usage extractor or the optimizer of FIG. 1, all arranged in accordance with embodiments of the present disclosure.

DETAILED DESCRIPTION OF ILLUSTRATIVE EMBODIMENTS

Figure 1:
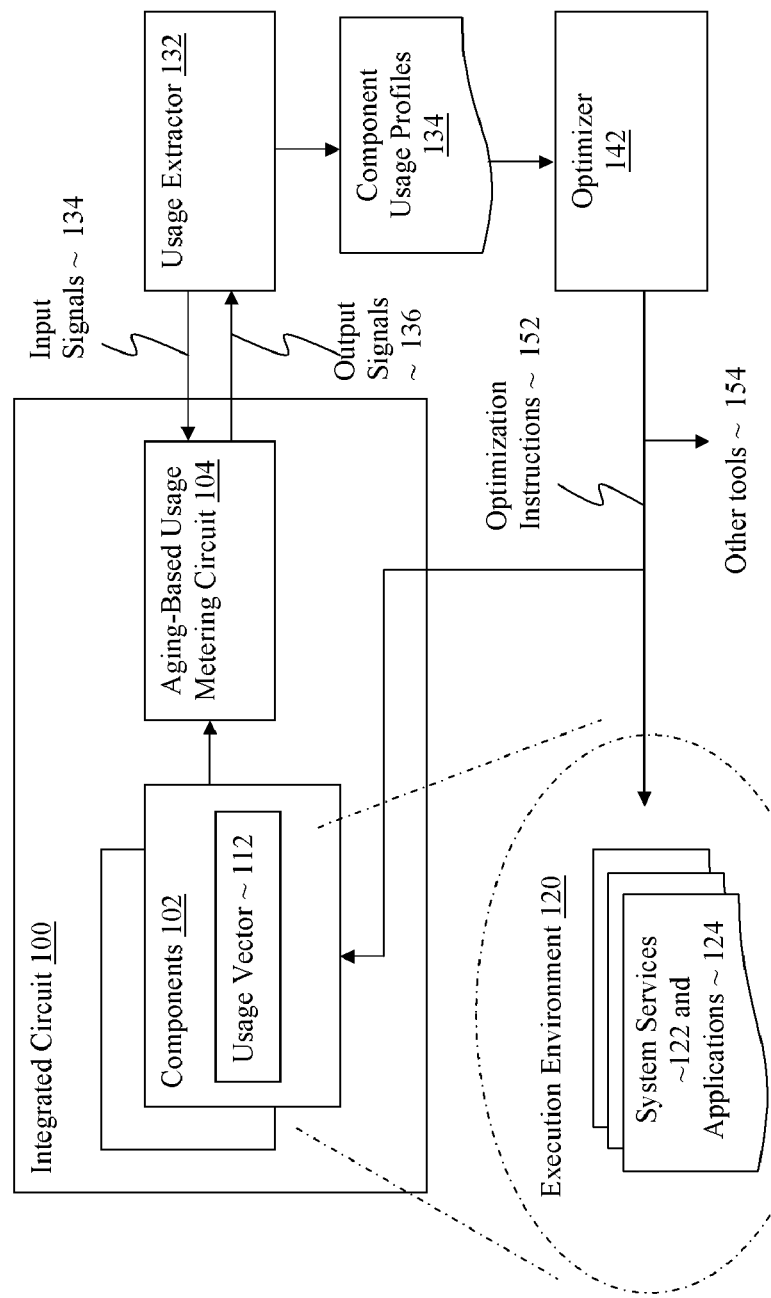
FIG. 1 illustrates an overview of an integrated circuit (IC) having components and an aging-based usage metering circuit for metering usage of the components, and related elements.

The following description sets forth various examples along with specific details to provide a thorough understanding of claimed subject matter. However, it will be understood by those skilled in the art that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

In the following description, algorithms and/or symbolic representations of operations on data bits and/or binary digital signals stored within a computing system, such as within a computer and/or computing system memory may be presented. An algorithm may generally be considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing," "processing," "retrieving," "calculating," "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

FIG. 1 illustrates an overview of an IC 100 having components and an aging-based usage metering circuit for metering usage of the components, and related elements, arranged in accordance with various embodiments. As shown, IC 100 may include a number of components 102 and an aging-based usage metering circuit 104 coupled to each other as shown.

Components 102 may include respective associated usage vectors 112 that are different from each other. Aging-based usage metering circuit 104, as will be described in more detail below, may include a number of circuit elements coupled to each other to form a number of corresponding different processing paths for processing the different usage vectors. Further, components 102 may include storage locations for respectively storing the associated usage vectors, and components 102 may be configured to respectively transmit their different usage vector 112 to aging-based usage metering circuit 104, whenever components 102 are used. Aging-based usage metering circuit 104 may be configured to process the different usage vectors 112, whenever they are received. The circuit elements of aging-based usage metering circuit 104 age over time, as a result of the repeated processing of the provided usage vectors 112, enabling usage of components 102 to be determined based on their aging. In alternate embodiments, aging-based usage metering circuit 104, in lieu of being disposed with IC 100, may be located outside of IC 100 as a standalone IC, or part of a larger system, e.g., a testing device.

In various embodiments, components 102 may be selected ones of a floating point unit (FPU), a multiplier, an arithmetic logic unit (ALU), a fixed point adder, or a cache line. Components 102 may be used to support an execution environment 120 for executing various system services 122 (such as, operating system services) and/or applications 124. Applications 124 may be any one of a number engineering, scientific, business and/or personal productivity (such as word processing, spreadsheet, or presentation) applications.

In various embodiments, the circuit elements of aging-based usage metering circuit 104 may be circuit components such as digital circuits (e.g. logic gate functions), analog circuits (e.g., transistors, capacitors, resistors, comparators, level shifters, amplifiers, etc.) or interconnects that may age as a result of usage, due to NBTI or HCI (in the case of gates) or electromigration (in the case of interconnects). As the circuit components or interconnects age due to usage, the propagation delays, the leakage current or the switching power of the circuit components or interconnects may increase. Accordingly, through the provision of the different usage vectors respectively associated with the components to the aging-based usage metering circuit 104, processing by circuit 104 having different processing paths for different usage vectors, and aging of the circuit elements of the processing paths due to their usage, usage of components 102 may be determined, to be described more fully below.

Continuing to refer to FIG. 1, for some embodiments, usage extractor 132 may be provided to determine usage of components 102, and create component usage profiles 134, using aging-based usage metering circuit 104. In various embodiments, usage extractor 132 may be configured to provide input signals 134 to aging-based usage metering circuit 104, which in response, may propagate the input signals 134, and generate output signals 136, wherein generation of the output signals 106 may be aging affected. Usage extractor 132, in turn, may determine usage of components 102 based on aging-affected output signals 136, in particular, based on the delays of output signals 136. In alternate embodiments, usage extractor 132 may be disposed within and part of IC 100, as a dedicated separate component, or constituted using at least some of components 102, or one of the system services 122 and/or applications 124 operating in execution environment 120.

Still referring to FIG. 1, for the embodiments, optimizer 142 may be provided to generate optimization instructions 152 for one or more of components 102, system services 122 and/or applications 124, based on component usage profiles 134. In other embodiments, optimizer 142 may additionally or alternatively generate optimization instructions 152 for tools that are used to design components 102 or generate system services 122 or applications 124. Examples of tools used to design components 102 may include, but are not limited to, synthesis tools, place and route tools, or layout tools, whereas examples of tools used to create or generate system services 122 or applications 124 may include, but are not limited to, pre-compilers, compilers, runtime executors, interpreters, and so forth. Likewise, in alternate embodiments, optimizer 142 may be disposed within and part of IC 100, as a dedicated separate component, or constituted using at least some of components 102, or one of the system services 122 and/or applications 124.

Having now provided an overview description, aging-based usage metering circuit 104, usage extractor 132 and optimizer 142, and their associated operations will be further described in turn below.

Turning first to aging-based usage metering circuit 104, in the various embodiments, circuit 104 may be designed or formed with circuit elements which performance are substantially irreversibly dependent upon their accumulative activity or usage, with such usage resulting in their performance changes. The aging-based usage metering circuit 104, in general, may include at least one circuit path having at least one circuit element. The circuit element may have at least one age-affected parameter or attribute that is subjected to aging affects caused by the accumulative usage, with such aging effects being reflected in age-affected output signal 136 from aging-based usage metering circuit 104.

In general, the performance of aging-based usage metering circuit 104 may degrade based upon its usage, with such degradation including, for example, increasing delays or deteriorating power characteristics (e.g., increase in switching power usage and increase in leakage power). However, such performance changes of aging-based usage metering circuit 104 may not be limited to changes causing degradation. In some embodiments, aging-based usage metering circuit 104 may include at least one logic circuit or one transistor, which are subject to various types of degradations. In other embodiments, aging-based usage metering circuit 104 may include at least one interconnect, which is subject to slowdown as a function of age/usage. In yet other embodiments, aging-based usage metering circuit 104 may incorporate other aging phenomena for usage metering, such as material fatigue, change in frequencies of crystal clocks, loss in ability of flash memory to rewrite data, changes in frequency response of fiber bandwidth, or demagnetizing of some components of magnetic disks. Therefore, the aging-based usage metering circuits, using gates, transistors and/or interconnects, shown in the various embodiments herein are merely illustrative. There are many different circuit components and age-affected component parameters that may be used in aging-based usage metering circuit 104 for metering usage of components 102. Likewise, there are many different circuit structures for the aging-based usage metering circuits 104 that may be used for metering usage of components 102, and the butterfly networks used in the various embodiments and described below with references to FIG. 2 are merely illustrative of one such circuit structure.

As alluded to earlier, in some embodiments, aging-based usage metering circuit 104, instead of being predesigned and included in IC 100 as a small embedded hardware component solely for performing the aging-based usage metering function, may be a standalone IC. In yet other embodiments, aging-based usage metering circuit 104 may be one or more components of an already existing system, such as a processor, or integrated into a Finite State Machine (FSM). Depending upon the embodiment, the illustrated IC components of IC 100 may comprise multiple chips mounted on a circuit board, or comprise multiple chips in multiple devices or circuit boards.

In various embodiments, the aging-based usage metering circuit 104 may include one or more circuit paths including one or more circuit components (e.g., gates, transistors, etc.), as previously mentioned. Each of the circuit elements may have an element "parameter" (e.g., gate delay) subjected to aging effects from the accumulative usage of the aging-based usage metering circuit 104. In response to an input signal 134, the aging-based usage metering circuit 104 may be arranged to provide one of the age-affected signals 136. The generation of the age-affected signal 136 may have a "characteristic" reflective of aging effects of the one or more circuit elements.

Figure 2:
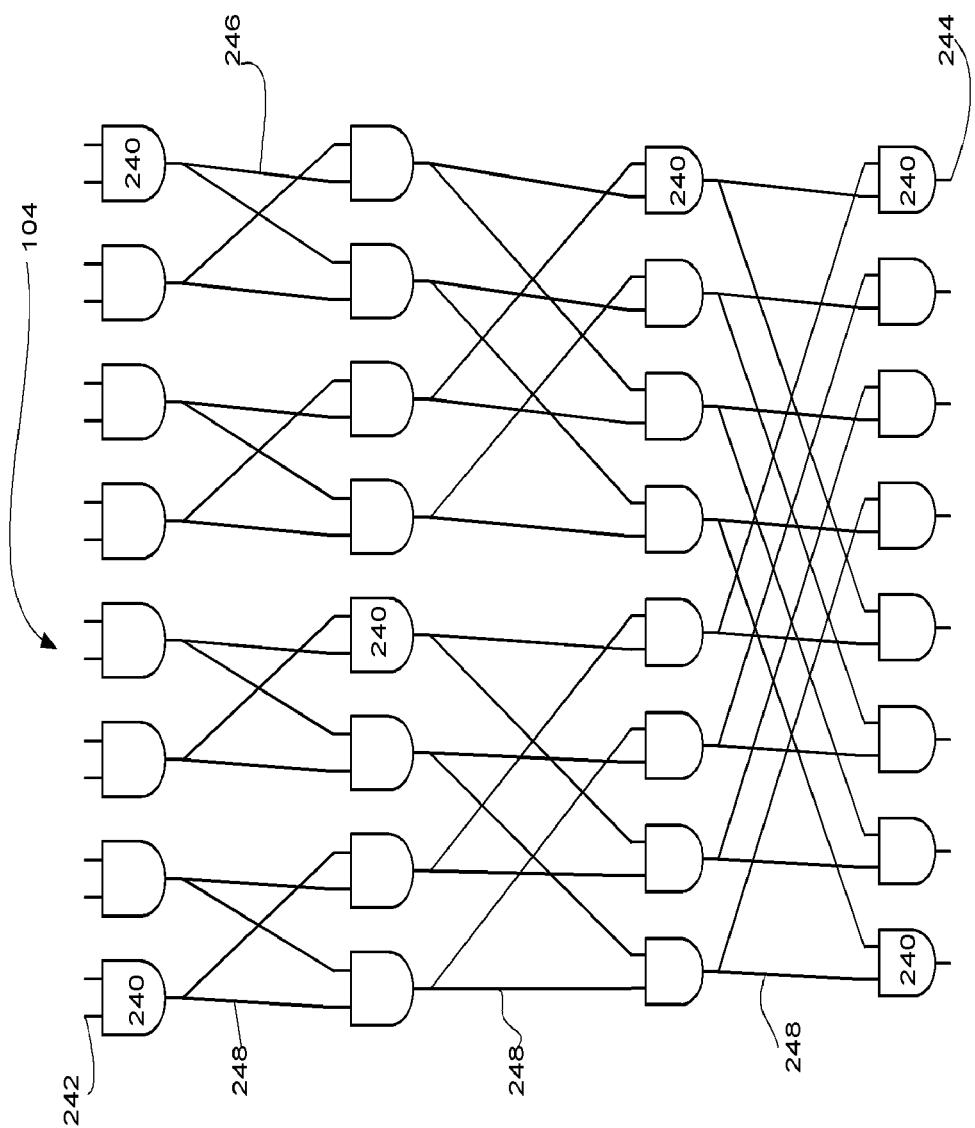
FIG. 2 illustrates an expanded view of an example of the aging-based usage metering circuit of FIG. 1.

Referring now to FIG. 2, wherein an expanded view of an example aging-based usage metering circuit 104 of FIG. 1, arranged in accordance with various embodiments, is illustrated. As shown, aging-based usage metering circuit 104 may take the form of an expanded butterfly network which includes a network of gates having a butterfly topology. For the embodiments, aging-based usage metering circuit 104 may have sixteen inputs 242, four levels and eight outputs 244. Each of the outputs of gates 240 on all but the last level may be coupled to two gates 240 on the next lowest level via wires/links 246. Each path 248 may contain four gates 240. Such butterfly networks may be used as the aging-based usage metering circuit 104, since there are exponentially large number paths and because the structure may include mutually independent paths. Furthermore, the structure is scalable. The gates 240 are represented in FIG. 2 with a generic gate symbol, which is not intended to be an AND gate.

Usage extractor 132 may be configured to determine the delays of several delay paths 248, with each of the delay paths 248 extending from one of the inputs 242 of the aging-based usage metering circuit 104 to one of the outputs 244. From these analyzed path delays, the usage extractor 132 may be arranged to calculate the gate delays of the individual gates 240, to be described more fully below. In alternate embodiments, the usage extractor 132 may be arranged to determine the leakage current or switching power required for gates 240 in generating outputs 244.

Once the delay, leakage current or switching power of each gate 240 is determined, usage extractor 132, using the aging models, may be arranged to calculate (and therefore measure) the degree to which each gate 240 has been degraded, and therefore extract how long each individual gate 240 has been under stress. For some embodiments, the value of stress may define the generated quantity of accumulative usage of the aging-based usage metering circuit 104.

For various embodiments, the delay paths 248 may overlap each other and may be distinguishable (mutually independent) due to each delay path 248 including a unique subset of gates 240. Hence, to extract the accumulative usage of one of the components 102, where a plurality of components 102 are contributing to the accumulative usage of the aging-based usage metering circuit 104, the usage extractor 132 may be adapted for such use.

More specifically, in some embodiments, each gate 240 may go under stress for some set of components 102 (identified as components $C_i$ in the calculations provided hereinafter). Since a component $C_i$ has a unique signature vector $\rho_i$, it contributes to the aging of a subset of gates 240 in the aging-based usage metering circuit 104. Once the total usage (stress) of each gate 240 is known, through another stage of calculation, individual usage time of component $C_i$ may be calculated, providing the accumulative usage of the component $C_i$. Moreover, the accumulative usages of a plurality of component $C_i$ may be calculated. In summary, the accumulative usage of one of the components 102 may be a calculated portion of the accumulative usage of the aging-based usage metering circuit 104.

In various embodiments, the techniques employed by usage extractor 132 may include solving a multi-stage optimization problem of computing the delays of gates, their aging degradation factors, and finally the component usage using, for example, convex programming. In some embodiments, a method may be used by usage extractor 132 for determining delays, leakage current, switching power and/or other characteristics of the gates and/or interconnects, by creating system of equations where each equation may correspond to a single or multiple observations after application of a pair of input signals 134. With respect to solving the system equation of this method, in some embodiments, usage extractor 132 may be configured to use the following programming convex programming, linear or piece-wise convex programming, and nonlinear programming.

For example, the propagation delay of a CMOS based digital gate can be expressed as:

$$d = \frac{C_L V_{dd}}{I_d} = \frac{C_L V_{dd} L_{eff}}{\mu C_{ox} W_{eff}(V_{gs}-V_{th})^\alpha} \quad (1)$$

where $\alpha$ is the velocity saturation index, $V_{dd}$ is the supply voltage, $C_L$ contains the lumped capacitance of the load including parasitic capacitance and other parameters are technology dependant constants. $C_{ox}$ is the per-unit area capacitance of the oxide layer, $L_{eff}$ and $W_{eff}$ are the effective gate length and width, $V_{th}$ is the threshold, $V_{gs}$ is the gate to source voltage, $I_d$ is the drain current, and u is a constant. Using Equation 1, the delay degradation, $\Delta d$, for a given gate can be derived as:

$$\frac{\Delta d}{d_0} = \frac{\alpha \Delta V_{th}}{V_{gs}-V_{th}} \quad (2)$$

where $d_0$ is the original delay of the gate without any $V_{th}$ degradation, and can be extracted from third-party time analysis tools.

Negative bias temperature instability (NBTI) causes circuit aging which will introduce a shift in $V_{th}$ over time. The shift in the transistor threshold voltage, $\Delta V_{th}$, can be derived using analytical models. With respect to how does $V_{th}$ degrade as the aging-based usage metering circuit 104 is being used, there are several studies which cover this issue thoroughly and model the aging of digital circuits. For example, an analytical model of NBTI degradation has been introduced which relates $V_{th}$ degradation to usage time as follows:

$$\Delta V_{th} K_C \times \alpha_S S_i^{2/3} \times t^{1/6} \quad (3)$$

which illustrates the power dependency of $V_{th}$ degradation with a fixed time exponent of ⅙. In this illustrative embodiment, Equation 3 may be the basis of aging-based usage metering, since it relates gate usage time (stress) to $V_{th}$ shift. When a gate is being used it means that it is under either Direct Current (DC) or Alternating Current (AC) stress. Hence, "gate usage time" and "stress time" may be used interchangeably in this description.

Thus, for a set of k components, $\Sigma = \{C_1, \ldots, C_k\}$, where each component $C_i$ is used multiple times for an unknown arbitrary time $t_i$. The objective is to find the times $t_i$s efficiently with accuracy in the presence of measurement errors and imperfect degradation models.

Once individual gate delays are characterized, usage extractor 132 may use the following equations to extract the amount of shift in threshold voltage for gate i:

$$\Delta V_{th_i} = \frac{d_i - d_0}{d_0} \frac{V_{gs}-V_{th}}{\alpha} \quad (4)$$

where $d_0$ is the initial gate delay. In the gate stress time calculation, the following equation is used to find the total amount of time that gate i has been under stress:

$$t_i = \left(\frac{\Delta V_{th_i}}{K_C \times \alpha_S S_i^{\frac{2}{3}}}\right)^6 \quad (5)$$

where the above-identified parameters are the same as in the earlier equations.

Each of the one or more circuit paths of the aging-based usage metering circuit 104 may extend from a path input to a path output, with the one or more circuit elements of the path circuit being coupled between the path input and the path output. The age-affected output signal 136 generated by aging-based usage metering circuit 104 at its path output may reflect performance changes in age-affected element parameters or attributes of the circuit elements included in the circuit path. Consequently, each age-affected output signal 136 may contain at least one signal characteristic (e.g., signal path delay) reflecting the aging of the one or more circuit elements in the circuit path of aging-based usage metering circuit 104. Initially, before any aging (and therefore before any accumulative usage of aging-based usage metering circuit 104), each output signal 136 may be referred to as "non-age-affected signal." After aging (and therefore with some quantity of accumulative usage of aging-based usage metering circuit 104), each output signal 136 may be referred to as an "age-affected signal."

In the various embodiments, the age-affected circuit elements used in the circuit paths of aging-based usage metering circuit 104 may include, but not be limited to, a logic gate, a transistor, an interconnect, a capacitor, a resistor, an inductor or like circuit elements that change or age through usage. In the various embodiments, the age-affected element parameters of such circuit element may include, but not be limited to, a gate delay, and an interconnect delay, power consumption or leakage or like component parameter that change or age through usage. In the illustrated examples involving delay, the circuit paths of the aging-based usage metering circuit 104 may be referred to as "delay paths."

Once the gate delay, leakage current, or switching power of each gate is found, usage extractor 132, using an aging model, may calculate (and therefore measure) the degree to which each gate has been degraded, and therefore extract how long each individual gate has been under stress.

Figure 5:
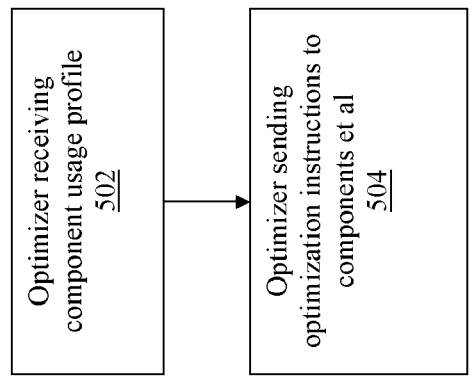
FIGS. 3-5 illustrates various methods of operation of the IC, usage extractor and optimizer of FIG. 1.
Figure 4:
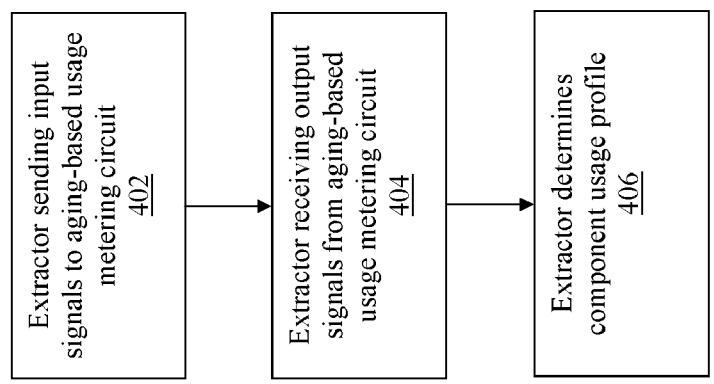
Figure 3:
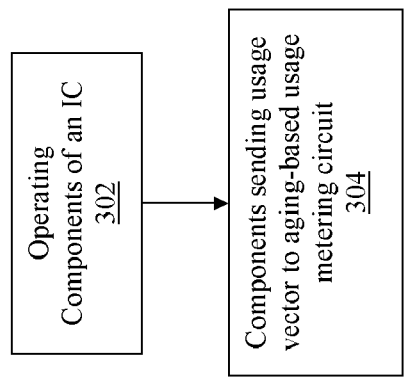

Referring now to FIG. 3-5, wherein various methods of operations associated with IC 100, usage extractor 132 and optimizer 142, arranged in accordance with various embodiments, are illustrated. As shown in FIG. 3, at block 302 ("Operating Components of an IC"), a component 102 of IC, such as a floating point unit, an arithmetic logic unit, and so forth, may be used, e.g. to provide execution environment 120. In response, proceeding from block 302 to block 304 ("Components sending usage vector to aging-based usage metering circuit"), the component 102, configured with an associated usage vector that is different from other usage vectors associated with other components 102, in response, may transmit its associated usage vector to aging-based usage metering circuit 104.

As shown in FIG. 4, at block 402 ("Extractor sending input signals to aging-based usage metering circuit"), usage extractor 132, after usage of components 102 have been metered by aging-based usage metering circuit 104 for a period of time, may send one or more input signals to aging-based usage metering circuit 104. In response, at block 404 ("Extractor receiving output signals from aging-based usage metering circuit"), usage extractor 132, may receive age-affected output signals 136 from aging-based usage metering circuit 104. Proceeding from block 404 to block 406 ("Extractor determines component usage profile"), at which, usage extractor 132 may determine the aging effects, such as delays, leakage current or switching power of the circuit elements of the aging-based usage metering circuit 104, and in turn, based on the aging affects, determine the usage of components 102, as earlier described.

As shown in FIG. 5, at block 502 ("Optimizer receiving component usage profile"), optimizer 142, after usage extractor 132 has generated component usage profiles 134, may receive the component usage profiles 134. In response, at block 504 ("Optimizer sending optimization instructions to components et al."), optimizer 142, may determine one or more optimization instructions for one or more components 102, system services 122, applications 124 or other tools 154, based on the component usage profiles 134, and transmit the one or more optimization instructions 152 to the one or more components 102 et al. The manner of the determination, the nature of the optimization instructions, and the manner of providing the optimization instructions may all be application dependent. For example, an optimization instruction 152 for a synthesis tool may be in the form of gate sizes, determined in part from power leakage inferred from the component usage, and provided to the synthesis tool in the form of a dataset. In another example, an optimization instruction 152 for a task scheduler of an operating system may be in the form of task balancing, determined in part from the usage of floating point units, and provided to the task scheduler in the form of a message.

Figure 6:
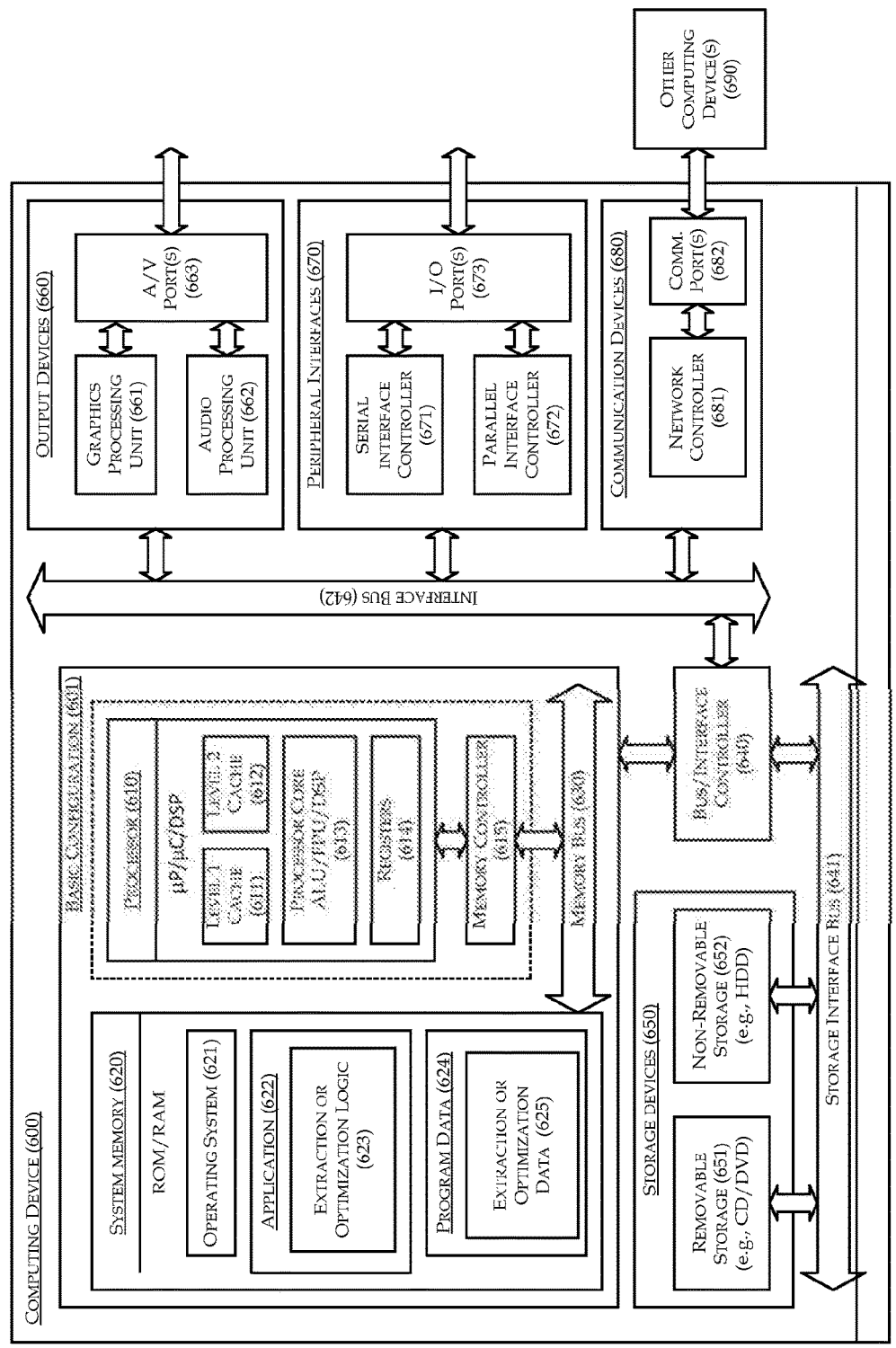
FIG. 6 illustrates an example computing device suitable for use to perform the operations of the usage extractor and the optimizer of FIG. 1.

FIG. 6 is a block diagram illustrating an example computing device 600, arranged in accordance with the present disclosure. In a very basic configuration 601, computing device 600 typically includes one or more processors 610 and system memory 620. A memory bus 630 may be used for communicating between the processor 610 and the system memory 620.

Depending on the desired configuration, processor 610 may be of any type including but not limited to a microprocessor (µP), a microcontroller (µC), a digital signal processor (DSP), or any combination thereof. Processor 610 may include one more levels of caching, such as a level one cache 611 and a level two cache 612, a processor core 613, and registers 614. An example processor core 613 may include an arithmetic logic unit (ALU), a floating point unit (FPU), a digital signal processing core (DSP Core), or any combination thereof. An example memory controller 615 may also be used with the processor 610, or in some implementations the memory controller 615 may be an internal part of the processor 610.

Depending on the desired configuration, the system memory 620 may be of any type including but not limited to volatile memory (such as RAM), non-volatile memory (such as ROM, flash memory, etc.) or any combination thereof. System memory 620 may include an operating system 621, one or more applications 622, and program data 624. Application 622 may include extraction or optimization logic 623 configured to implement usage extractor 132 and/or optimizer 142. Program Data 624 may include data 625 associated with extraction or optimization logic 623. In some embodiments, application 622 may be arranged to operate with program data 624 on an operating system 621.

In various embodiments, extraction or optimization logic 623 may be employed to extract usage data and optimize usage of a component of computing device 600 provided with an aging circuit as earlier described, e.g., processor 610, system memory 620, and so forth. In some embodiments, extraction or optimization logic 623 may be employed to extract usage data and optimize usage of an external component coupled with computing device 600, and provided with an aging circuit as earlier described. The external component may be coupled with computing device 600 via one or more communication interfaces described below.

Computing device 600 may have additional features or functionality, and additional interfaces to facilitate communications between the basic configuration 601 and any required devices and interfaces. For example, a bus/interface controller 640 may be used to facilitate communications between the basic configuration 601 and one or more data storage devices 650 via a storage interface bus 641. The data storage devices 650 may be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 620, removable storage 651 and non-removable storage 652 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 642 for facilitating communication from various interface devices (e.g., output interfaces, peripheral interfaces, and communication interfaces) to the basic configuration 601 via the bus/interface controller 640. Example output devices 660 include a graphics processing unit 661 and an audio processing unit 662, which may be configured to communicate to various external devices such as a display or speakers via one or more A/V ports 663. Example peripheral interfaces 670 include a serial interface controller 671 or a parallel interface controller 672, which may be configured to communicate with external devices such as input devices (e.g., keyboard, mouse, pen, voice input device, touch input device, etc.) or other peripheral devices (e.g., printer, scanner, etc.) via one or more I/O ports 673. An example communication device 680 includes a network controller 681, which may be arranged to facilitate communications with one or more other computing devices 690 over a network communication link via one or more communication ports 682.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 may also be implemented as a personal computer including both laptop computer and non-laptop computer configurations.

Articles of manufacture and/or systems may be employed to perform one or more methods as disclosed herein. FIG. 7 illustrates a block diagram of an example article of manufacture having a computer program product 700 for metering usage of components of an integrated circuit, arranged in accordance with various embodiments of the present disclosure. The computer program product 700 may comprise non-transitory computer-readable storage medium 702 and plurality of programming instructions 704 stored in the computer-readable storage medium 702.

In various ones of these embodiments, programming instructions 704 may be configured to enable an apparatus, in response to execution by the apparatus, to perform operations including:
transmitting a number of input signals to an aging-based usage metering circuit;
receiving, in response, from the aging-based usage metering circuit, a number of output signals; and
determining, usage of components an integrated circuit based on the aging of the circuit elements of the aging-based usage metering circuit.

In various ones of these embodiments, programming instructions 704 may be configured to enable an apparatus, in response to execution by the apparatus, to perform operations including:
receiving determined usage of components of an IC; and
generating, in response, an optimization instruction for one of the components, a system service that uses one or more of the components, an application that uses one or more of the components, a tool employed to design one of the components or a tool employed to generate the system service or application, based on determined usage of the component.

As described earlier, in these embodiments, the aging-based usage metering circuit includes a number of circuit elements coupled with each other, and aged over time as a result of processing respective usage vectors of the components provided to the aging-based usage metering circuit, whenever the components are used. Further, the circuit elements are coupled in such a manner that enables usage of the components to be determined based on the aging of the circuit elements.

Computer-readable storage medium 702 may take a variety of forms including, but not limited to, non-volatile and persistent memory, such as, but not limited to, compact disc read-only memory (CDROM) and flash memory.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with," etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software may become significant) a design choice representing cost versus efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that individual function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific ICs (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in ICs, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled," to each other to achieve the desired functionality, and any two components capable of being so associated may also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. An apparatus arranged to meter usage of one or more components of an integrated circuit, the apparatus comprising:
   one or more storage locations configured to store respective usage vectors, wherein a usage vector of the usage vectors is associated with a particular component of the one or more components of the integrated circuit; and
   a metering circuit coupled with the one or more components of the integrated circuit, wherein the metering circuit includes one or more processing paths, a processing path of the one or more processing paths corresponds to the particular component of the integrated circuit, and the processing path includes a set of circuit elements, wherein the processing path is effective to receive and process the usage vector, and wherein an age of the set of circuit elements is based on a number of times the usage vector is received and processed by the processing path, and the age of the set of circuit elements is effective to indicate a usage of the particular component of the integrated circuit.

2. The apparatus according to claim 1, wherein the set of circuit elements comprises digital circuit elements, analog circuit elements, or interconnects, and wherein delays of the digital circuit elements, the analog circuit elements, and the interconnects increase as the digital circuit elements, the analog circuit elements, and the interconnects age with usage of the one or more components.

3. The apparatus according to claim 2, wherein the set of circuit elements comprises digital circuit elements including a plurality of gates.

4. The apparatus according to claim 2, wherein the set of circuit elements comprises analog circuit elements including transistors, capacitors, resistors, comparators, level shifters, or amplifiers.

5. The apparatus according to claim 1, wherein the one or more storage locations are correspondingly disposed within respective components of the one or more components.

6. The apparatus according to claim 5, wherein the one or more components are part of the apparatus, and the particular component is configured to transmit the usage vector to the metering circuit in response to usage of the particular component.

7. The apparatus according to claim 6, wherein the one or more components comprise a floating point unit, a multiplier, an arithmetic logic unit, a fixed point adder, or a cache line.

8. The apparatus according to claim 1, further comprising an extractor configured to transmit one or more input signals to the metering circuit, wherein the metering circuit is configured to generate one or more output signals in response to the receipt of the one or more input signals.

9. The apparatus according to claim 8, wherein the extractor is further configured to receive the one or more output signals from the metering circuit, and determine usage of the particular component based on delays, leakage current, or switching power of the set of circuit elements of the processing path.

10. The apparatus according to claim 1, further comprising an optimizer configured to generate, based on the usage of the particular component as indicated by the set of circuit elements, an optimization instruction for the particular component, a system service that uses the particular component or an application that uses the particular component.

11. The apparatus according to claim 1, further comprising an optimizer configured to generate, based on the usage of the particular component as indicated by the set of circuit elements, an optimization instruction for a tool employed to design the particular component or a tool employed to generate a system service or an application that uses the particular component.

12. A method to meter usage of one or more components of an integrated circuit, the method comprising:
   receiving, by a metering circuit, a usage vector from a particular component of the one or more components of the integrated circuit, wherein the metering circuit includes one or more processing paths, wherein a processing path of the one or more processing paths corresponds to the particular component, and wherein the processing path includes a set of circuit elements;
   processing, by the metering circuit, the usage vector, wherein an age of the set of circuit elements is based on a number of times the usage vector is received and processed by the metering circuit, and the age of the set of circuit elements is effective to indicate a usage of the particular component; and;
   determining, by the metering circuit, the usage of the particular component based on the age of the set of circuit elements of the processing path to meter the usage of the one or more components of the integrated circuit.

13. The method according to claim 12, further comprising:
   receiving, by the metering circuit, a plurality of input signals; and
   transmitting, by the metering circuit, a plurality of output signals, wherein the output signals are effective to indicate the age of the set of circuit elements.

14. The method of claim 12, wherein determining the usage of the particular component comprises determining the usage of the particular component based on delays, leakage current, or switching power of the set of circuit elements.

15. The method of claim 12, further comprising:
   receiving the determined usage of the particular component; and
   generating, based on the determined usage of the particular component, an optimization instruction for the one or more components, a system service that uses the one or more components, or an application that uses one or more of the components.

16. The method of claim 12, further comprising:
   receiving the determined usage of the particular component; and
   generating, based on the determined usage of the particular component, an optimization instruction for a tool employed to design one of the components, or for a tool employed to generate a system service or an application that uses the one or more components.

17. An article of manufacture to meter usage of components of an integrated circuit, comprising:
   non-transitory computer-readable storage medium; and
   at least one instruction stored in the non-transitory computer-readable storage medium, and configured to enable an apparatus, in response to execution of the at least one instruction by the apparatus, to perform operations including:
      controlling a transmission of an input signal from an extractor to a metering circuit of the integrated circuit, wherein the metering circuit includes one or more processing paths, wherein a processing path of the one or more processing paths corresponds to a particular component of the components of the integrated circuit, wherein the processing path includes a set of circuit elements, the metering circuit is configured to generate an output signal in response to a receipt of the input signal;
      identifying a receipt of the output signal at the extractor, wherein the output signal is generated and transmitted by the metering circuit; and
      determining usage of the particular component based on the output signal received at the extractor, wherein the output signal is effective to indicate an age of the set of circuit elements, wherein the age of the set of circuit elements is based on a number of times a usage vector associated with the particular component is received and processed by the metering circuit, the age of the circuit elements is effective to indicate a usage of the particular component, and wherein the usage of the components is determined based on the delays, leakage current or switching power of the set of circuit elements.

18. The article of claim 17, wherein determining the usage of the particular component comprises determining usage of the particular component based on delays of the output signal.

19. The article of claim 17, wherein the operations further comprise:
   generating, based on the determined usage of the particular component, an optimization instruction for one of the components, a system service that uses one or more of the components, or an application that uses the particular component.

20. The article of claim 17, wherein the operations further comprise:
   generating, based on the determined usage of the particular component, an optimization instruction for a tool employed to design one of the components or a tool employed to generate a system service or an application that uses one or more of the particular component.

* * * * *